(12) United States Patent
Iwamatsu et al.

(10) Patent No.: US 7,332,776 B2
(45) Date of Patent: Feb. 19, 2008

(54) SEMICONDUCTOR DEVICE

(75) Inventors: Toshiaki Iwamatsu, Tokyo (JP);
Yuuichi Hirano, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/826,569

(22) Filed: Jul. 17, 2007

(65) Prior Publication Data
US 2007/0257330 A1 Nov. 8, 2007

Related U.S. Application Data

(62) Division of application No. 11/137,586, filed on May 26, 2005.

(30) Foreign Application Priority Data
Jun. 3, 2004 (JP) .............................. 2004-165480

(51) Int. Cl.
*H01L 27/01* (2006.01)
(52) U.S. Cl. ...................... 257/347; 257/348; 257/350; 257/351; 257/E29.287
(58) Field of Classification Search ................ 257/347, 257/348, 350, 351, E29.287
See application file for complete search history.

(56) References Cited

U.S. PATENT DOCUMENTS

| 6,495,898 B1 | 12/2002 | Iwamatsu et al. |
| 2002/0110989 A1 | 8/2002 | Yamaguchi et al. |
| 2005/0078546 A1 | 4/2005 | Hirano et al. |

FOREIGN PATENT DOCUMENTS

| JP | 2000-243973 | 9/2000 |
| JP | 2001-230315 | 8/2001 |

OTHER PUBLICATIONS

U.S. Appl. No. 09/466,934, filed Dec. 20, 1999, Yamaguchi et al.
U.S. Appl. No. 11/034,938, filed Jan. 14, 2005, Yamaguchi et al.

*Primary Examiner*—Lynne Gurley
*Assistant Examiner*—Samuel A Gebremariam
(74) *Attorney, Agent, or Firm*—McDermott Will & Emery LLP

(57) ABSTRACT

A partial isolation insulating film provided between MOS transistors in an NMOS region and a PMOS region, respectively, has a structure in which a portion protruding upward from a main surface of an SOI layer is of greater thickness than a trench depth, namely, a portion (isolation portion) extending below the surface of the SOI layer, and the SOI layer under the partial isolation insulating film is of greater thickness than the isolation portion.

2 Claims, 20 Drawing Sheets

F I G. 2 2
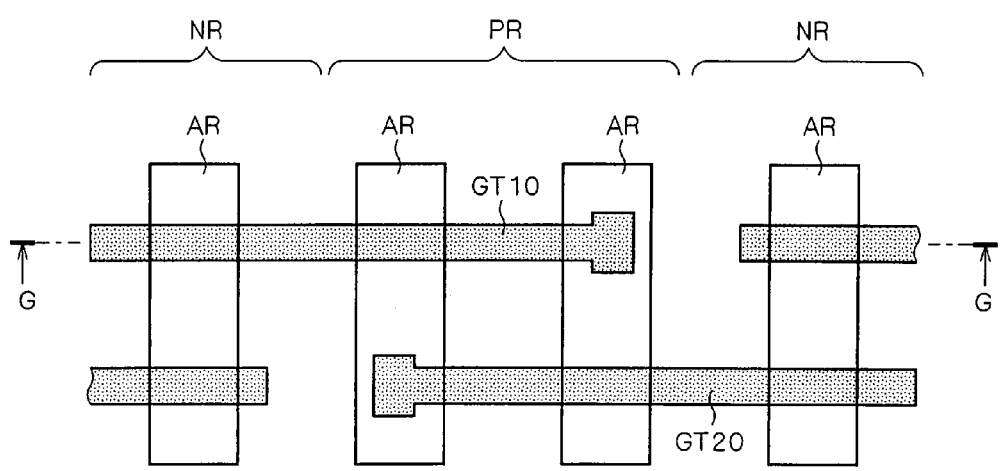

SEMICONDUCTOR DEVICE

This application is a Divisional of U.S. application Ser. No. 11/137,586, filed May 26, 2005, claiming priority of Japanese Application No. 2004-165480, filed Jun. 3, 2004, the entire contents of each of which are hereby incorporated by reference.

BACKGROUND OF THE INVENTION

1. Field of the Invention

This invention relates to semiconductor devices, and in particular to a semiconductor device having a hybrid trench isolation structure that combines a full trench isolation structure and a partial trench isolation structure.

2. Description of the Background Art

A semiconductor device of SOI (Silicon On Insulator) structure (hereafter called "SOI device"), which is formed on an SOI substrate including a buried oxide film and an SOI layer provided on a silicon substrate, allows parasitic capacitance reduction and operates with stability at high speed with low power consumption, and is used for a portable device and the like.

By way of example, an SOI device has a full trench isolation (FTI) structure in which elements are electrically isolated by a full trench isolation insulating film formed by providing a trench that reaches the buried oxide film in the surface of the SOI layer, and filling the trench with an insulating material.

However, there have been various kinds of problems resulting from a substrate floating effect, such as the accumulation of carriers (holes in an NMOS) generated by an impact ionization phenomenon in a channel forming region which leads to kinks, deterioration of operating breakdown voltage, and the occurrence of frequency dependency of delay time due to potential instability of the channel forming region.

Thus devised is a partial trench isolation (PTI) structure which is formed by providing a trench in the surface of the SOI layer while leaving the SOI layer in a predetermined thickness between the bottom of the trench and the buried oxide film, and filling the trench with an insulating material.

The PTI structure allows movements of carriers through a well region under the trench isolation insulating film thus preventing the accumulation of carriers in a channel forming region, and also allows the potential of the channel forming region to be fixed through the well region, not causing the various problems resulting from the substrate floating effect.

In addition, there has been proposed a hybrid trench isolation (HTI) structure that combines the respective characteristics of the FTI structure and the PTI structure, as described in Japanese Patent Application Laid-Open Nos. 2001-230315 (FIG. 1) and 2000-243973 (FIGS. 55 to 57).

The HTI structure has a cross-sectional shape that includes a full trench portion reaching the buried oxide film through the SOI layer, and a partial trench portion having the SOI layer provided thereunder.

With smaller semiconductor elements, the likelihood is that a gate length of a transistor, spacing between wirings, and the like will be shortened, and dimensions in the vertical direction (direction perpendicular to a substrate main surface) such as a gate height, the thickness of an interlayer insulating film, the thickness of an SOI layer, and the like will be correspondingly reduced as well, resulting in a scale-down of the whole device.

With the progress of scale-down, however, it becomes necessary to reduce the thickness of the isolation oxide film in the PTI structure as well. When a gate electrode extends over the isolation oxide film, the parasitic capacitance of the gate electrode may increase too much to ignore.

SUMMARY OF THE INVENTION

It is an object of this invention to provide a semiconductor device that prevents an increase in parasitic capacitance of a gate electrode even with side reduction of the semiconductor device.

In a first aspect of this invention, a semiconductor device includes: an SOI substrate including a substrate part serving as a base, a buried oxide film provided on the substrate part, and an SOI layer provided on the buried oxide film; first and second element isolation insulating films provided in first and second regions on the SOI layer, respectively; and a third element isolation insulating film provided between the first and second regions. The first and second element isolation insulating films have a partial trench isolation structure having the SOI layer provided thereunder. The third element isolation insulating film at least partly includes a full trench isolation structure reaching the buried oxide film through the SOI layer. The first and second element isolation insulating films have a structure in which a protruding portion protruding upward from a main surface of the SOI layer is of greater thickness than an isolation portion extending below the main surface of the SOI layer.

Since the first and second element isolation insulating films have a structure in which the protruding portion protruding upward from the main surface of the SOI layer is of greater thickness than the isolation portion extending below the main surface of the SOI layer, when a gate electrode extends over the first and second element isolation insulating films, a parasitic capacitance increase of the gate electrode can be suppressed, which leads to favorable device operation.

In a second aspect of this invention, a semiconductor device includes: an SOI substrate including a substrate part serving as a base, a buried oxide film provided on the substrate part, and an SOI layer provided on the buried oxide film; first and second element isolation insulating films provided in first and second regions on the SOI layer, respectively; and a third element isolation insulating film provided between the first and second regions. The first element isolation insulating film has a partial trench isolation structure having the SOI layer provided thereunder. The second and third element isolation insulating films at least partly include a full trench isolation structure reaching the buried oxide film through the SOI layer. The first element isolation insulating film has a structure in which a protruding portion protruding upward from a main surface of the SOI layer is of greater thickness than an isolation portion extending below the main surface of the SOI layer. The second element isolation insulating film only has the full trench isolation structure. The third element isolation insulating film has a hybrid trench isolation structure including the full trench isolation structure and the partial trench isolation structure, the partial trench isolation structure being formed such that the protruding portion is of greater thickness than the isolation portion, and the under-isolation SOI layer is of greater thickness than the isolation portion. The protruding portion of the second element isolation insulating film and the protruding portion of the full trench isolation structure of the third element isolation insulating film are of smaller thickness than the protruding portion of the first element isolation insulating film.

Since the protruding portion of the second element isolation insulating film and the protruding portion of the full trench isolation structure of the third element isolation insulating film are of smaller thickness than the protruding portion of the first element isolation insulating film, a range of gate length variation is reduced, which allows easy dimensional control of the gates.

These and other objects, features, aspects and advantages of this invention will become more apparent from the following detailed description of this invention when taken in conjunction with the accompanying drawings.

BRIEF DESCRIPTION OF THE DRAWINGS

FIG. 22 shows a plane configuration of the modification of the SOI device according to the second preferred embodiment.

DESCRIPTION OF THE PREFERRED EMBODIMENTS

<Introduction>

Prior to descriptions of preferred embodiments according to this invention, a process that has led to a technical concept of this invention will be described with reference to FIGS. 1 and 2.

Figure 1:
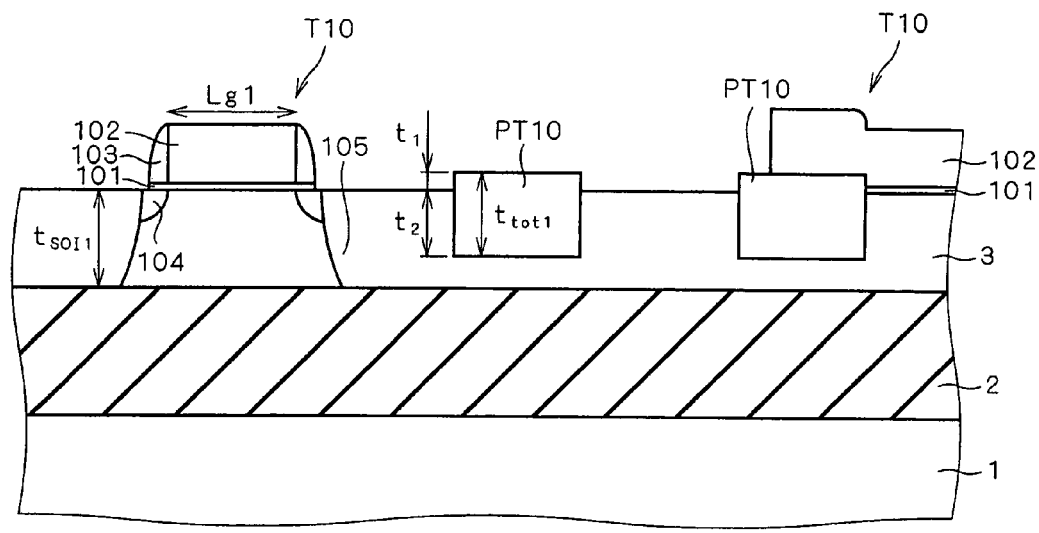
FIGS. 1 and 2 illustrate cross-sectional views of a configuration of a transistor and a partial isolation insulating film before and after a scale-down, respectively.
Figure 2:
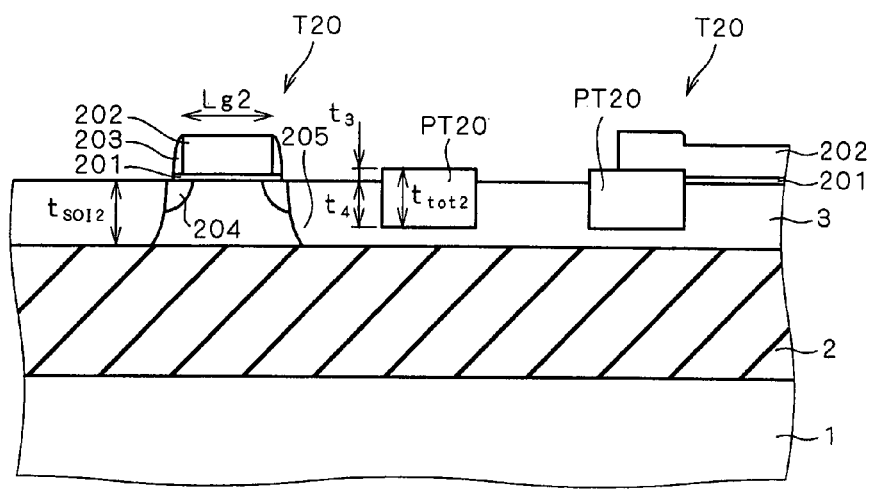

FIGS. 1 and 2 illustrate cross-sectional views of a configuration of a transistor and a partial isolation insulating film before and after a scale-down.

In FIG. 1 showing a before-scale-down state, two MOS transistors T10 are provided on an SOI substrate SB consisting of a silicon substrate 1, a buried oxide film 2 provided on the silicon substrate 1, and an SOI layer 3 provided on the buried oxide film 2.

The MOS transistors T10 are isolated from each other by a partial isolation insulating film PT10 having the SOI layer 3 provided thereunder.

The MOS transistors T10 each include a gate insulating film 101 provided selectively on the SOI layer 3, a gate electrode 102 provided on the gate insulating film 101, and a sidewall insulating film 103 provided to cover the side surfaces of the gate electrode 102.

The MOS transistor T10 on the left in FIG. 1 represents its cross-sectional shape in the gate length direction. The MOS transistor T10 on the right represents its cross-sectional shape in the gate width direction, where part of the gate electrode 102 extends over the partial isolation insulating film PT10.

A source/drain layer 105 is provided in the surface of the SOI layer 3 outside the sidewall insulating film 103 of the MOS transistor T10, and an extension layer 104 is provided at a shallower position than the source/drain layer 105.

The extension layer 104 which is an impurity layer so formed as to be a shallower junction than the source/drain layer has the same conductivity type as the source/drain layer, and functions as the source/drain layer. Thus the extension layer 104 should be called a source/drain extension layer, but is called an extension layer for the convenience of description.

Assume that the gate length of the MOS transistor T10 is Lg1, the thickness of the SOI layer 3 is $t_{SOI1}$, and the thickness of the partial isolation insulating film PT10 is $t_{tot1}$. In addition, assume that the thickness of a portion (called "protruding portion") of the partial isolation insulating film PT10 protruding upward from the main surface of the SOI layer 3 is $t_1$, and the thickness of a portion (called "isolation portion") of the partial isolation insulating film PT10 extending below the main surface of the SOI layer 3 is $t_2$. The sum of the thicknesses $t_1$ and $t_2$ is equal to the thickness $t_{tot1}$.

FIG. 2 shows a semiconductor device of this configuration that has been scaled down with a scale ratio of 0.7.

In FIG. 2, two MOS transistors T20 are provided on the SOI substrate SB, and are isolated from each other by a partial isolation insulating film PT20 having the SOI layer 3 provided thereunder.

The MOS transistors T20 each include a gate insulating film 201 provided selectively on the SOI layer 3, a gate electrode 202 provided on the gate insulating film 201, and a sidewall insulating film 203 provided to cover the side surfaces of the gate electrode 202.

The MOS transistor T20 on the left in FIG. 2 represents its cross-sectional shape in the gate length direction. The MOS transistor T20 on the right represents its cross-sectional shape in the gate width direction, where part of the gate electrode 202 extends over the partial isolation insulating film PT20.

A source/drain layer 205 is provided in the surface of the SOI layer 3 outside the sidewall insulating film 203 of the MOS transistor T20, and an extension layer 204 is provided at a shallower position than the source/drain layer 205.

Assume that the gate length of the MOS transistor T20 is Lg2, the thickness of the SOI layer 3 is $t_{SOI2}$, and the thickness of the partial isolation insulating film PT20 is $t_{tot2}$. In addition, assume that the thickness of a portion of the partial isolation insulating film PT20 protruding upward from the main surface of the SOI layer 3 is $t_3$, and the thickness of a portion of the partial isolation insulating film PT20 extending below the main surface of the SOI layer 3 is $t_4$. The sum of the thicknesses $t_3$ and $t_4$ is equal to the thickness $t_{tot2}$.

With a scale ratio of 0.7, the gate length Lg2 becomes substantially 0.7 times the gate length Lg1, the thickness $t_{SOI2}$ becomes substantially 0.7 times the thickness $t_{SOI1}$, and the thickness $t_{tot2}$ becomes substantially 0.7 times the thickness $t_{tot1}$.

In this manner, a scale-down of the semiconductor device is done by scaling down most of the elements according to the scale ratio in horizontal and vertical directions with respect to the main surface of the semiconductor substrate.

In response to the thickness reduction of the SOI layer 3 to 0.7 times the thickness $t_{SOI1}$, the thickness of the portion of the partial isolation insulating film PT20 extending within the SOI layer 3 is reduced to 0.7 times the thickness $t_2$, and the total thickness $t_{tot}2$ is proportionally reduced as well. This causes an increase in parasitic capacitance of the gate electrode 202 extending over the partial isolation insulating film PT20, which leads to unfavorable device operation.

For the thickness of the isolation insulating film not to be reduced with a scale-down, the thickness of the portion extending below the main surface of the SOI layer, namely, a trench depth, should be increased. In that case, however, the thickness of the SOI layer provided under the isolation insulating film is reduced, causing a possible increase in resistance value of that portion. In addition, the resistance value of the SOI layer will vary when the trench depth cannot be controlled with precision.

The inventors conducted a further study in view of the above, and reached a technical concept of increasing the thickness of the portion of the isolation insulating film protruding upward from the main surface of the SOI layer, rather than the thickness of the portion extending below the main surface of the SOI layer. Concretizations of this technical concept will be discussed in the preferred embodiments according to this invention described below.

A. First Preferred Embodiment

A-1. Device Structure

Figure 3:
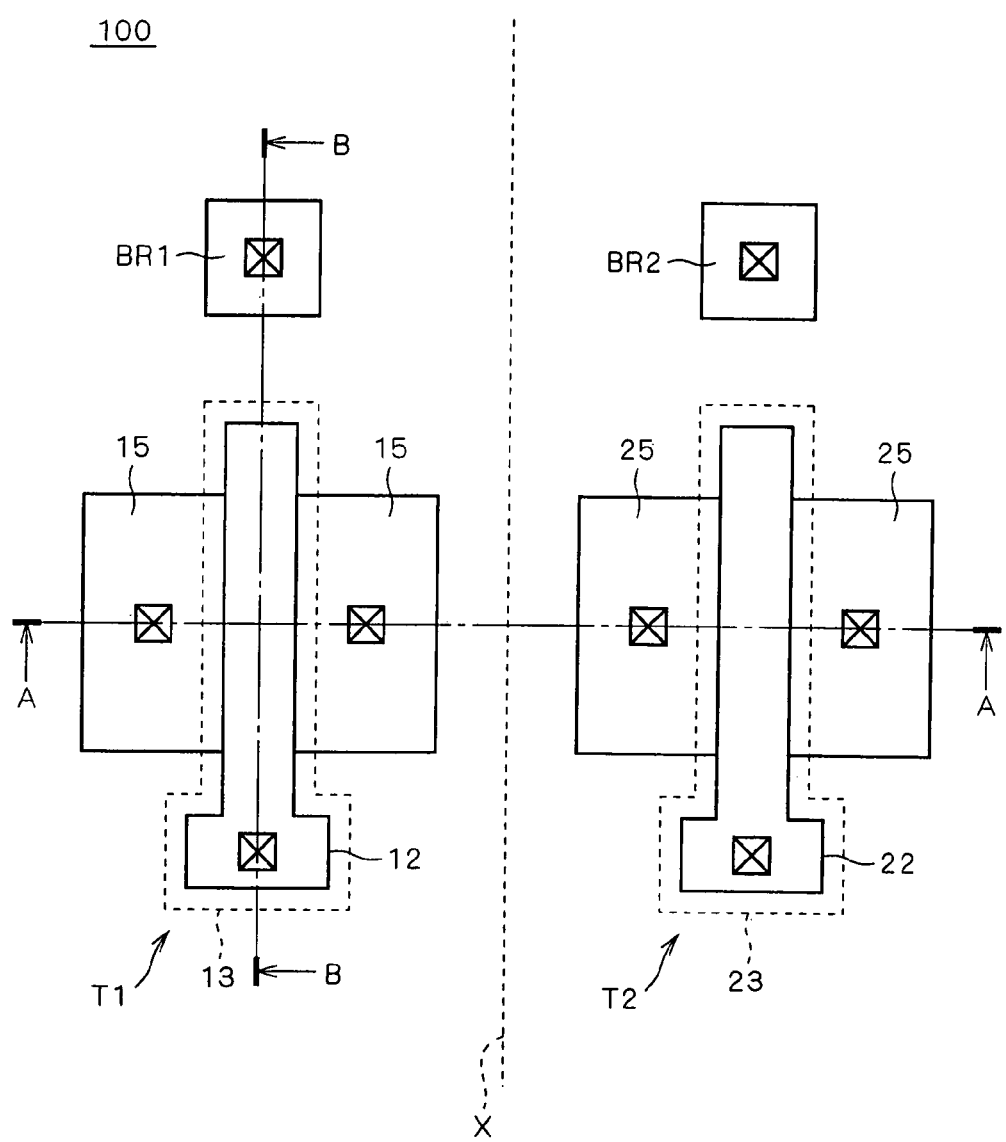
FIG. 3 shows a plane configuration of an SOI device according to a first preferred embodiment of this invention.

FIG. 3 illustrates a plan view of a configuration of an SOI device 100 according to a first preferred embodiment of this invention.

In FIG. 3, an N-channel type MOS transistor T1 and a P-channel type MOS transistor T2 are provided adjacently to each other so that their respective gate electrodes 12 and 22 are placed in parallel in the gate length direction.

Body fixing regions BR1 and BR2 for potential fixation are provided beyond the ends on one side in the gate width direction of the gate electrodes 12 and 22 of the MOS transistors T1 and T2, respectively.

The region where the MOS transistor T1 is provided and the region where the MOS transistor T2 is provided are electrically isolated from each other, which is indicated by a broken line X for the convenience of description in FIG. 3.

Figure 4:
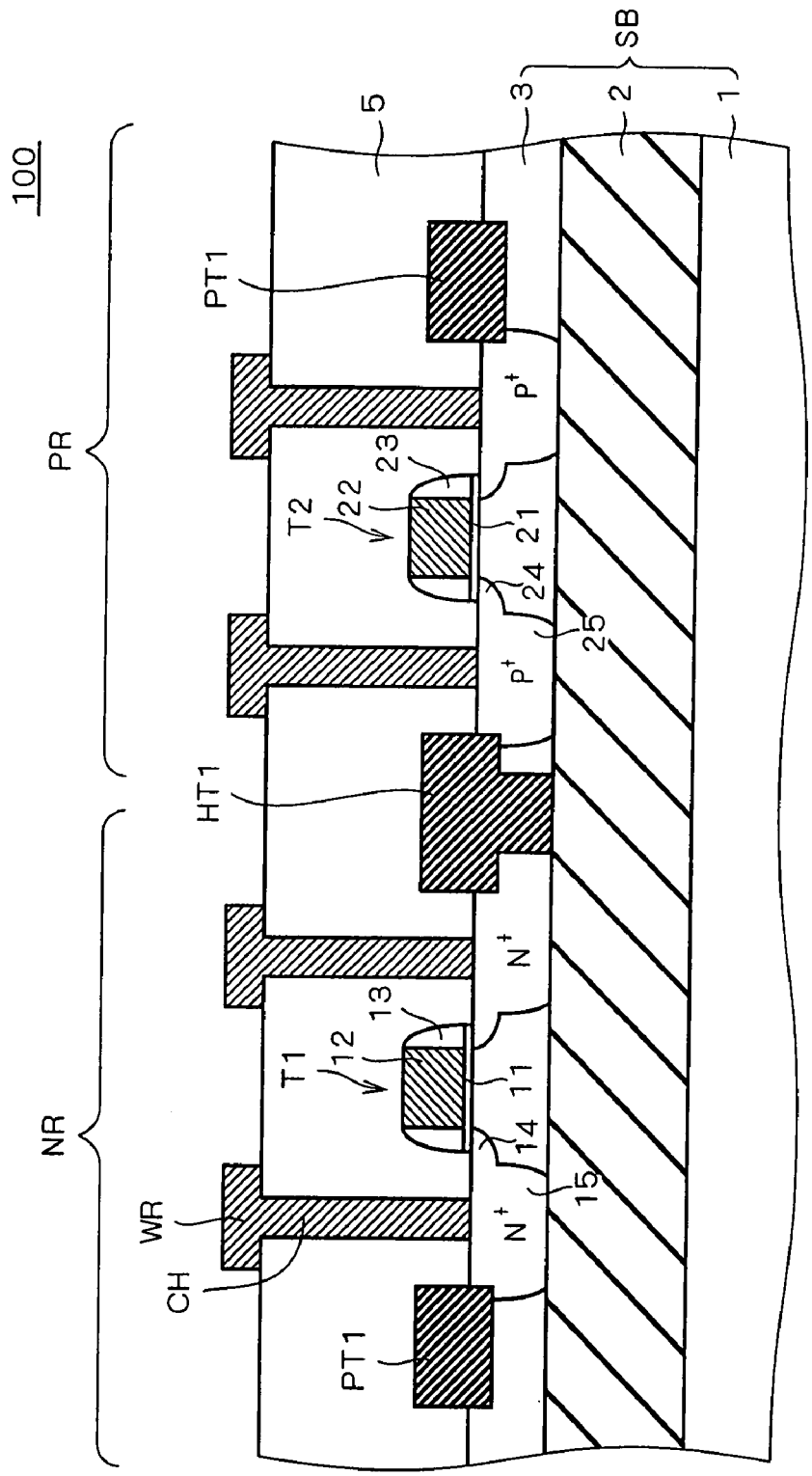
FIGS. 4 and 5 show cross-sectional configurations of the SOI device according to the first preferred embodiment.
Figure 5:
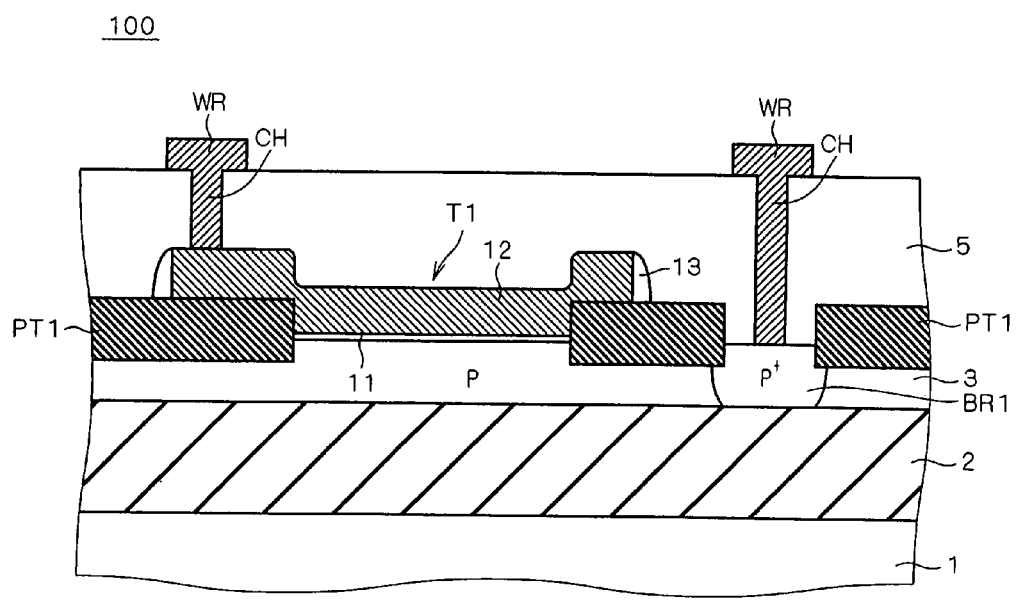

FIGS. 4 and 5 illustrate cross-sectional views of the configuration of the SOI device 100, taken along the lines A-A and B-B in FIG. 3, respectively.

As shown in FIG. 4, the SOI device 100 is provided on an SOI substrate SB consisting of a silicon substrate 1, a buried oxide film 2 provided on the silicon substrate 1, and an SOI layer 3 provided on the buried oxide film 2.

The surface of the SOI substrate SB is divided into an NMOS region NR (first region) where the N-channel type MOS transistor T1 is provided, and a PMOS region PR (second region) where the P-channel type MOS transistor T2 is provided. The two regions are electrically isolated from each other by a hybrid isolation insulating film HT1 having the hybrid trench isolation (HTI) structure that combines the FTI structure and the PTI structure.

The hybrid isolation insulating film HT1 has a substantially T-shaped cross-sectional shape that includes the FTI structure reaching the buried oxide film 2 through the SOI layer 3 at its center, and the PTI structure having the SOI layer 3 provided thereunder at its both ends.

It is to be noted that the hybrid trench isolation structure is not restricted to have the substantially T-shape mentioned above, but may have any cross-sectional shape as long as it includes the PTI and FTI structures.

In each of the NMOS region NR and the PMOS region PR, a partial isolation insulating film PTI is provided between MOS transistors.

Although FIGS. 3 and 4 only show one MOS transistor T1 and one MOS transistor T2 for the convenience of description, the respective numbers of the MOS transistors T1 and T2 are not restricted to these numbers.

As shown in FIG. 4, the MOS transistor T1 includes a gate insulating film 11 provided selectively on the SOI layer 3, a gate electrode 12 provided on the gate insulating film 11, and a sidewall insulating film 13 provided to cover the side surfaces of the gate electrode 12.

A source/drain layer 15 is provided in the surface of the SOI layer 3 outside the sidewall insulating film 13 of the MOS transistor T1, and an extension layer 14 is provided at a shallower position than the source/drain layer 15.

The MOS transistor T2 includes a gate insulating film 21 provided selectively on the SOI layer 3, a gate electrode 22 provided on the gate insulating film 21, and a sidewall insulating film 23 provided to cover the side surfaces of the gate electrode 22.

A source/drain layer 25 is provided in the surface of the SOI layer 3 outside the sidewall insulating film 23 of the MOS transistor T2, and an extension layer 24 is provided at a shallower position than the source/drain layer 25.

The extension layers 14 and 24 which are impurity layers so formed as to be shallower junctions than the source/drain layers have the same conductivity type as the source/drain layers, and function as the source/drain layers. Thus the extension layers 14 and 24 should be called source/drain extension layers, but are called extension layers for the convenience of description.

In addition, an interlayer insulating film 5 made of silicon oxide film, for example, is provided to cover the overall surface of the SOI substrate SB, and a plurality of contact portions CH are provided to be connected to the source/drain layers 15 and 25 through the interlayer insulating film 5. Each of the contact portions CH is connected to a wiring layer WR over the interlayer insulating film 5.

Multiple interlayer insulating films are additionally laminated on the interlayer insulating film 5, but are not shown for simplicity in FIG. 4.

Further, as shown in FIG. 5, the body fixing region BR1 in the region NR where the MOS transistor T1 is provided and the SOI layer 3 directly below the gate electrode 12 of the MOS transistor T1 are electrically connected to each other through the SOI layer 3 (under-isolation SOI layer) under the partial isolation insulating film PT1 having the partial isolation structure. Such connection is also established between the body fixing region BR2 in the region PR and the SOI layer 3 directly below the gate electrode 22 of the MOS transistor T2.

A-2. Manufacturing Method

Now a method of manufacturing the SOI device 100 will be described. FIGS. 6 to 12 illustrate cross-sectional views of the manufacturing steps in order.

Figure 6:
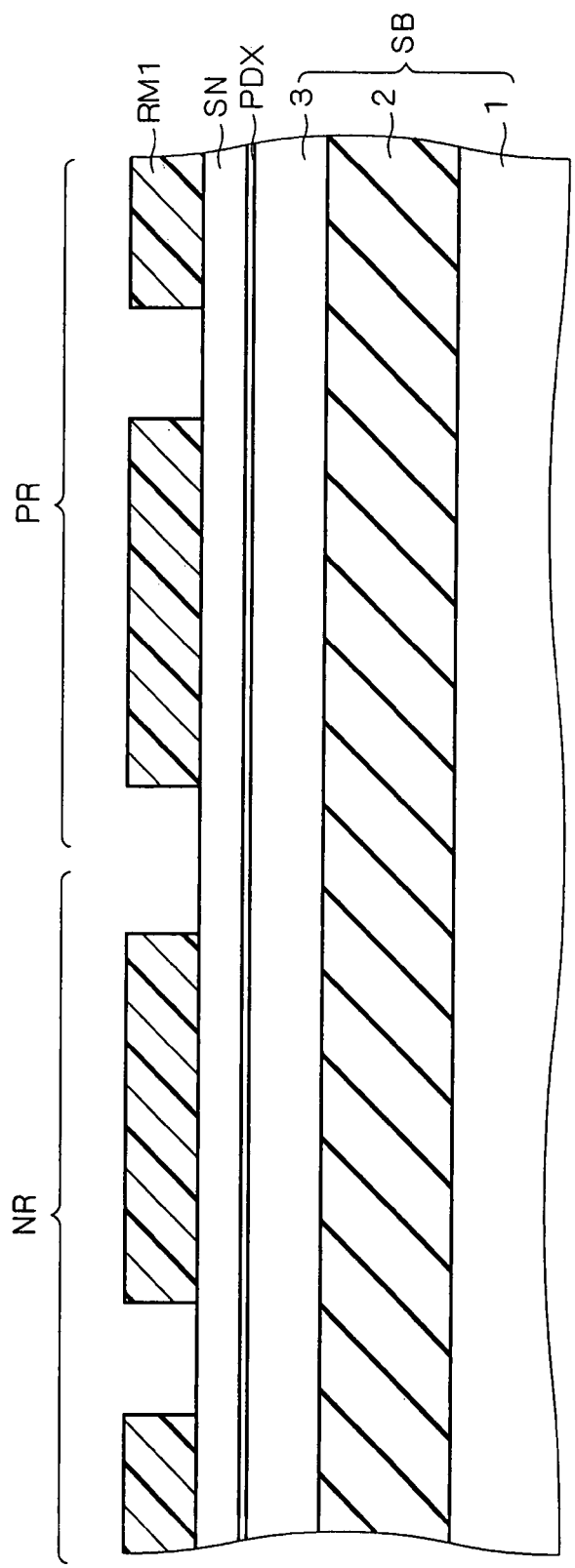
FIGS. 6 to 12 illustrate cross-sectional views for explaining a method of manufacturing the SOI device according to the first preferred embodiment.

First, in a FIG. 6 step, the SOI substrate SB consisting of the silicon substrate 1, the buried oxide film 2 and the SOI layer 3 is prepared by the SIMOX method, boding method, or the like. The thickness of the SOI layer 3 is 20 to 200 nm, and the thickness of the buried oxide film 2 is 10 to 400 nm.

Next, a pad oxide film PDX of 5 to 30 nm in thickness is formed on the SOI layer 3 by thermal oxidation, and then a silicon nitride film SN of 100 to 200 nm in thickness is deposited thereon by CVD at a forming temperature of 600 to 800 C.°.

Then, a resist mask RM1 is formed on the silicon nitride film SN by patterning. The resist mask RM1 has openings in which trenches are to be formed.

Figure 7:
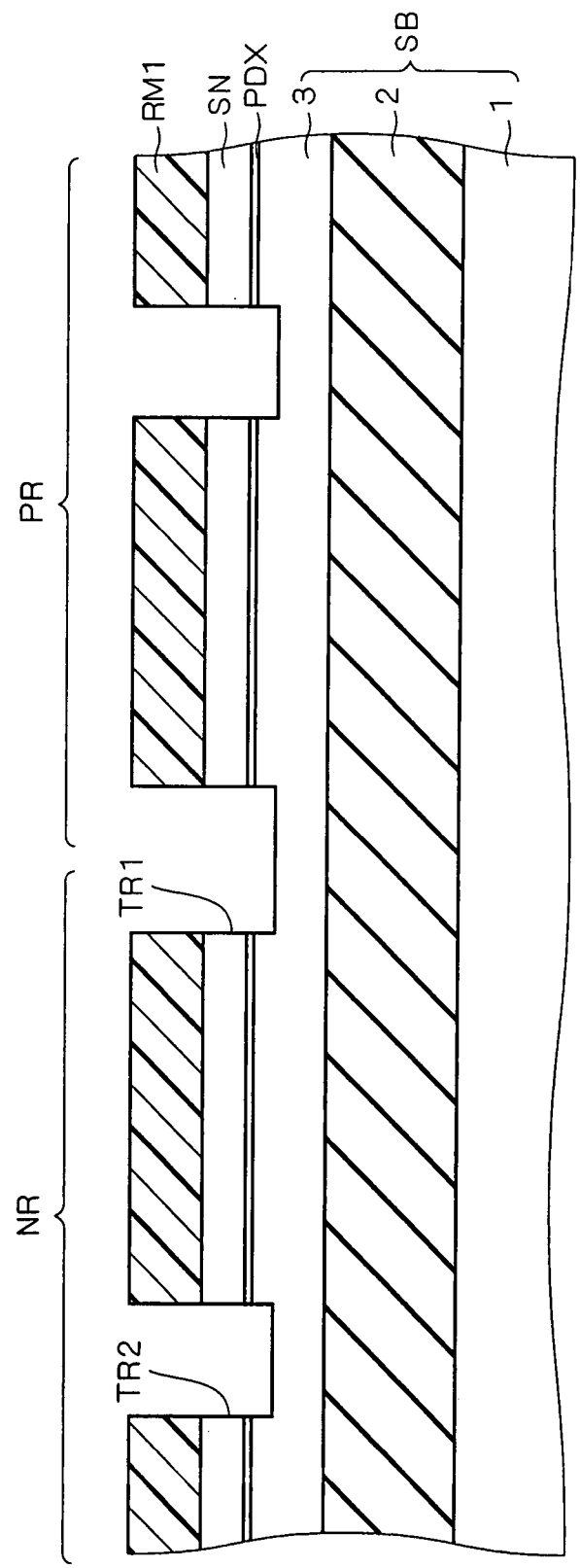

Subsequently, in a FIG. 7 step, the silicon nitride film SN, the pad oxide film PDX and the SOI layer 3 are patterned by etching with the resist mask RM1 as a mask, to form partial trenches TR1 and TR2 in the SOI layer 3. Conditions for this etching are adjusted so that the SOI layer 3 in a predetermined thickness, specifically in a thickness exceeding half the thickness thereof, remains at the bottoms of the trenches TR1 and TR2, without the SOI layer 3 being etched completely to expose the buried oxide film 2.

Figure 8:
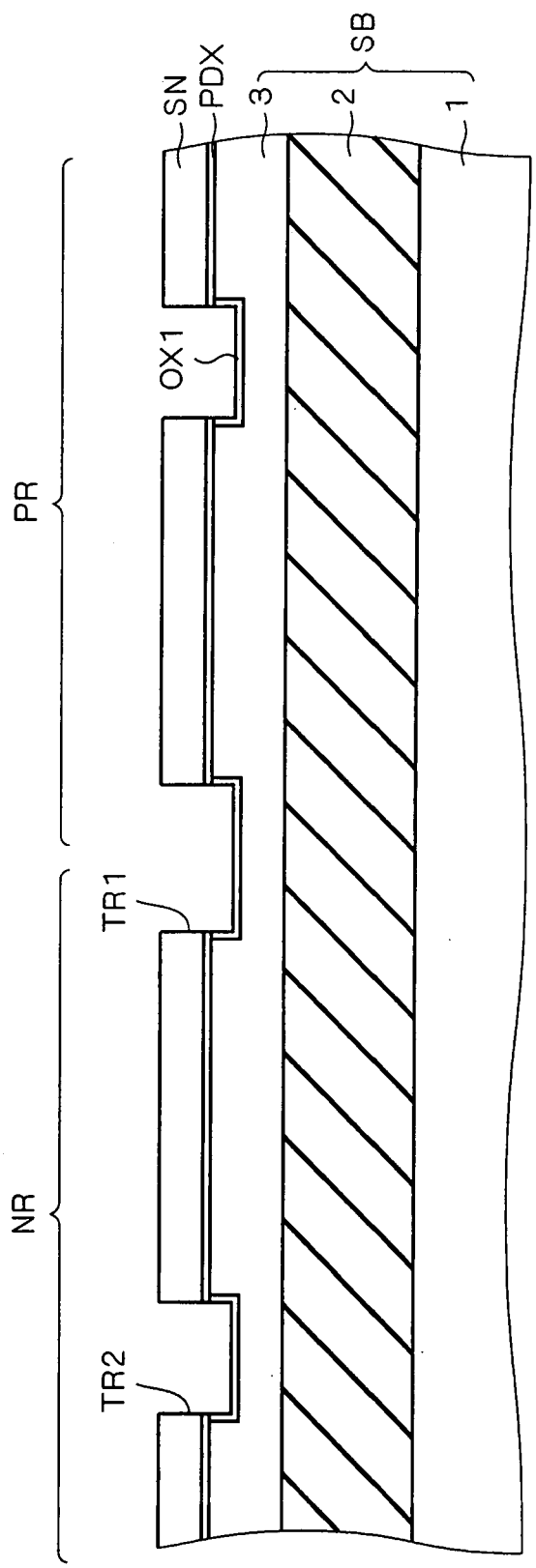

The resist mask RM1 is removed afterward, and then in a FIG. 8 step, the exposed SOI layer 3 is thermally oxidized at a temperature of 700 to 1100 C.°, to form a silicon oxide film OX1 of 5 to 30 nm in thickness on the surface of the SOI layer 3.

Figure 9:
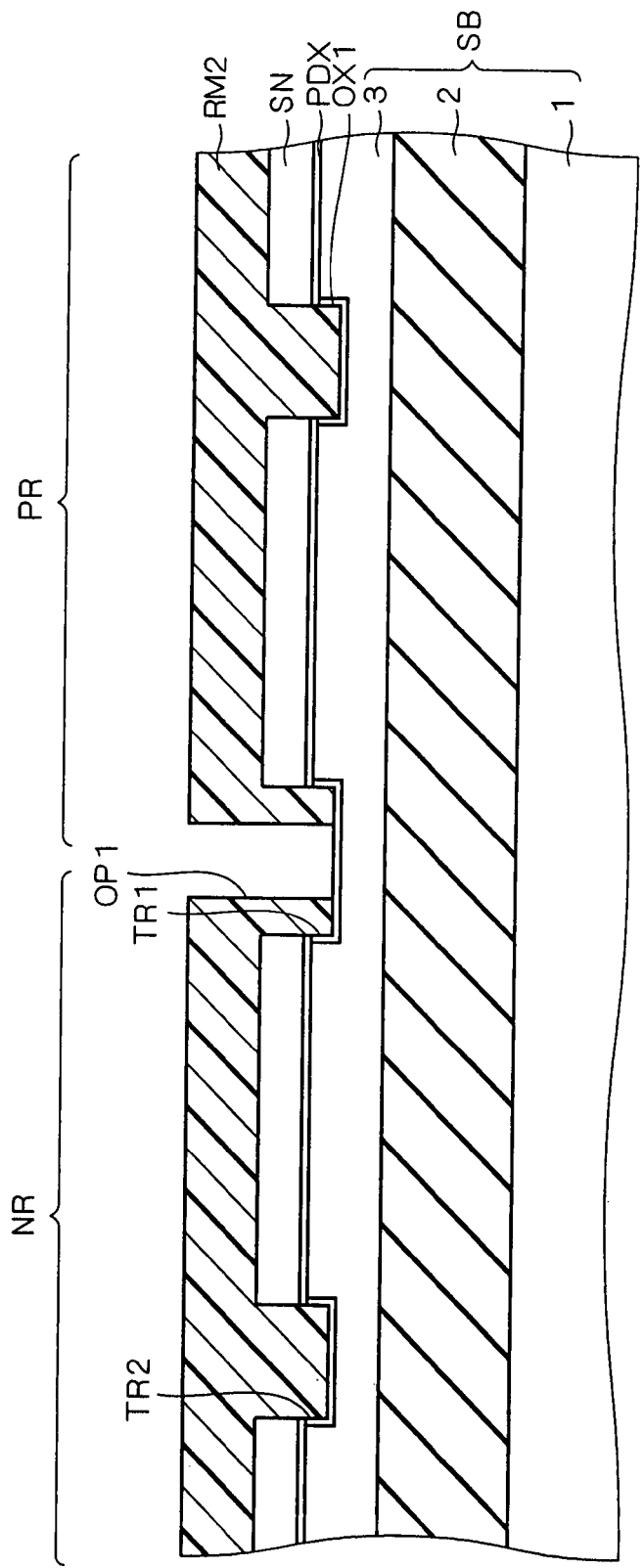

Next, in a FIG. 9 step, a resist mask RM2 is formed on the SOI substrate SB by patterning. The resist mask RM2 has a pattern with an opening OP1 that only corresponds to a predetermined portion of the trench TR1. More specifically, the opening OP1 only corresponds to the portion reaching the buried oxide film 2 through the SOI layer 3 in the hybrid isolation insulating film HT1 (FIG. 4) which will be formed later.

Figure 10:
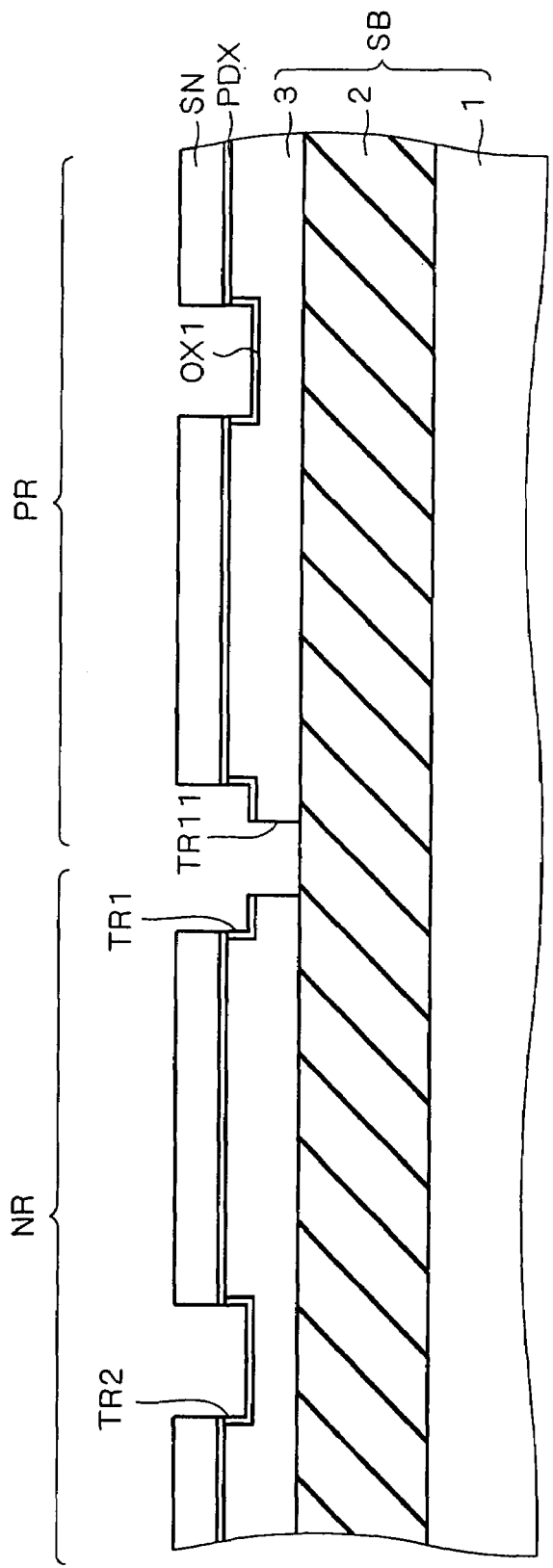

Next, in a FIG. 10 step, the trench TR1 is etched in accordance with the opening pattern of the resist mask RM2, and the buried oxide film 2 is exposed by etching, to form a trench TR11. The resist mask RM2 is then removed.

Figure 11:
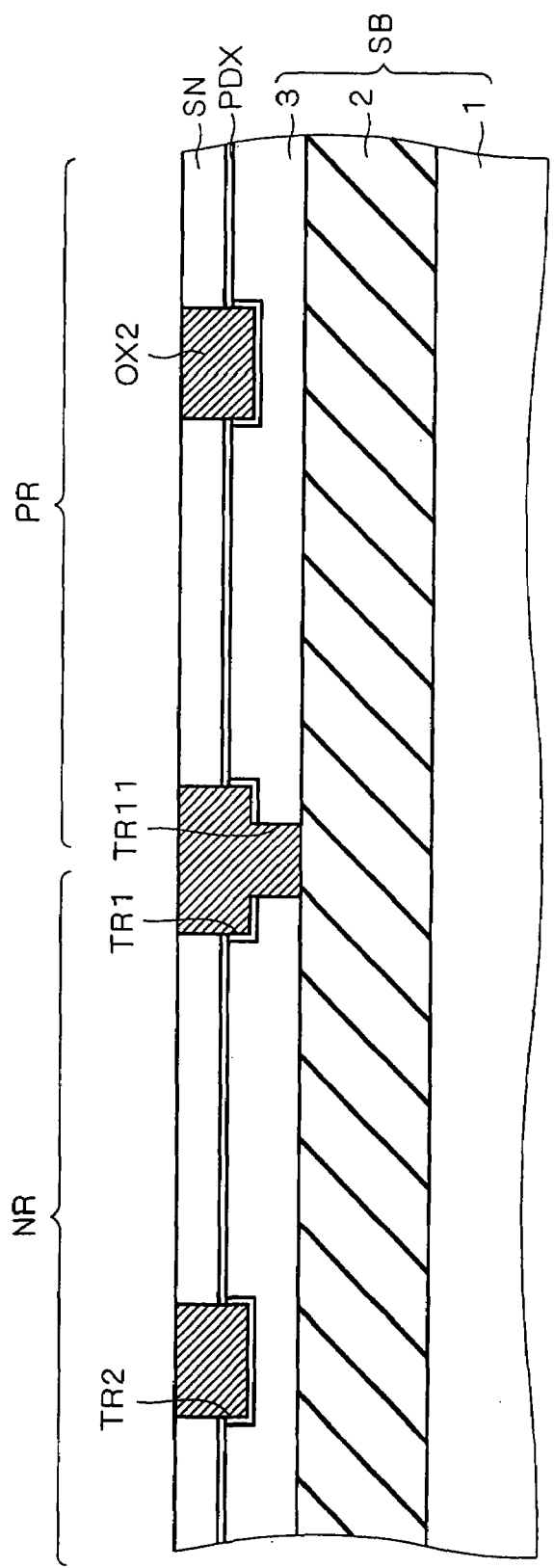

Next, in a FIG. 11 step, a silicon oxide film OX2 of 150 to 600 nm in thickness is formed on the overall surface of the SOI substrate SB, to fill the trenches TR1, TR11 and TR2 completely with the silicon oxide film OX2.

The silicon oxide film OX2 is formed by HDP (High Density Plasma)-CVD, for example. The HDP-CVD uses plasma of higher density by one or two digits than common plasma CVD, and deposits an oxide film by performing spattering and deposition at the same time, thus obtaining a silicon oxide film of favorable quality.

The silicon oxide film OX2, which is formed not only in the trenches TR1 and TR2 but to cover the overall surface of the SOI substrate SB, is polished and planarized by a CMP process to the point where at least the surface of the silicon nitride film SN is exposed. The polishing may be performed until the silicon nitride film SN is reduced substantially to half in thickness.

Figure 12:
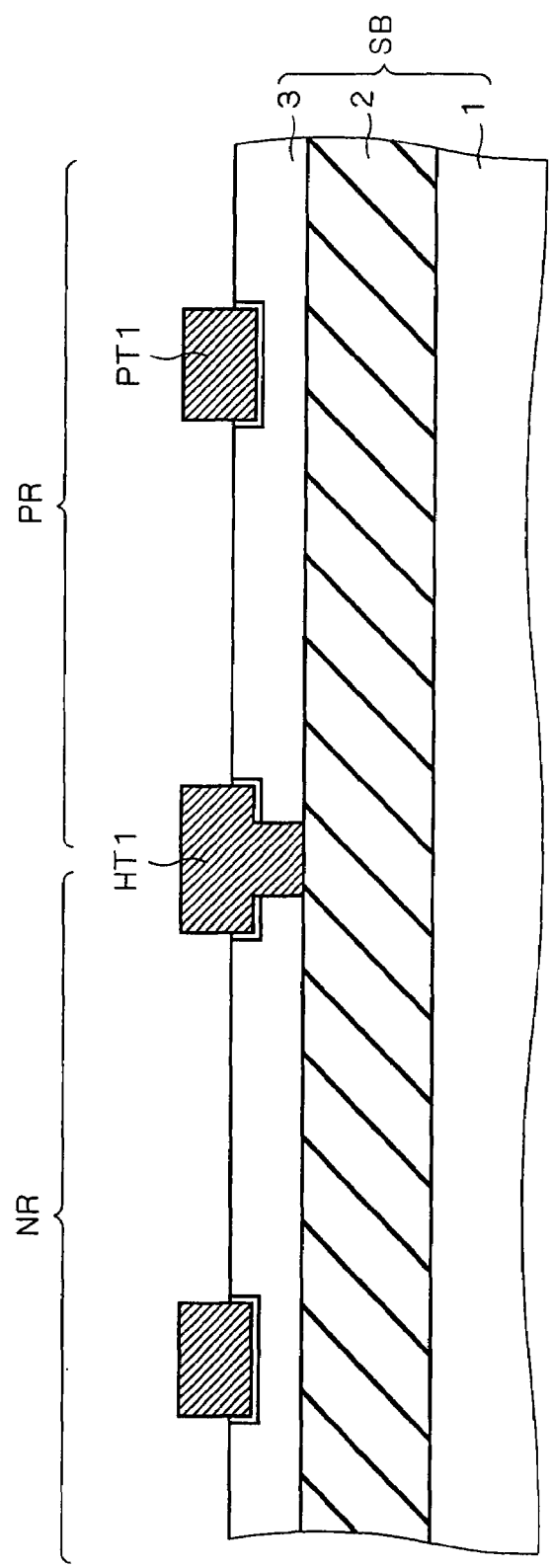

Next, in a FIG. 12 step, the silicon nitride film SN and the pad oxide film PDX are removed by wet etching or dry etching, to obtain the hybrid isolation insulating film HT1 having the HTI structure and the partial isolation insulating film PT1 having the PTI structure.

Although the existence of the silicon oxide film OX1 is indicated on the surface of the SOI layer 3 facing the hybrid isolation insulating film HT1 and the partial isolation insulating film PT1 in FIG. 12, they are regarded as being integrated and are not specifically indicated in FIG. 4.

After that, on active regions defined by the hybrid isolation insulating film HT1 and the partial isolation insulating film PT1, the gate insulating films 11 and 12, and the gate electrodes 12 and 22 are formed, ion implantations are performed with the gate electrodes 12 and 22 as masks to form the extension layers 14 and 24, respectively, and the sidewall insulating films 13 and 23 are formed on the side surfaces of the gate electrodes 12 and 22, respectively. Then, ion implantation is performed with the gate electrode 12 and the sidewall insulating film 13 as a mask to form the source/drain layer 15, while ion implantation is performed with the gate electrode 22 and the sidewall insulating film 23 as a mask to form the source/drain layer 25.

Finally, the interlayer insulating film 5 is formed on the overall main surface of the SOI substrate SB, the contact portions CH are provided to reach the/drain layers 15 and 25 through the interlayer insulating film 5, and the wiring layer WR is connected to the contact portions CH, thereby obtaining the SOI device 100 shown in FIG. 4.

A-3. Effect

In the SOI device 100 described above, carriers are movable between the body regions of the MOS transistors T1 and T2 and the body fixing regions BR1 and BR2, respectively, through the SOI layer 3 under the partial isolation insulating films PT1. This prevents the accumulation of carriers in a channel forming region, and also allows the potential of the channel forming region to be fixed, thereby suppressing the substrate floating effect.

As shown in FIGS. 4 and 5, the partial isolation insulating film PT1 provided between the MOS transistors in each of the NMOS region NR and the PMOS region PR has a structure in which the portion (protruding portion) protruding upward from the main surface of the SOI layer 3 is of greater thickness than a trench depth, namely, the portion (isolation portion) extending below the surface of the SOI layer 3, and the SOI layer 3 (under-isolation SOI layer) under the partial isolation insulating film PT1 is of greater thickness than the isolation portion.

Such structure can suppress an increase in parasitic capacitance of the gate electrode 12 extending over the partial isolation insulating film PTI, which leads to favorable device operation.

Such structure also causes the proportion of the isolation portion of the partial isolation insulating film PT1 in the SOI layer 3 to be reduced in thickness. Accordingly, even when the thickness of the SOI layer 3 is reduced according to a predetermined scale ratio as a result of a scale-down of the semiconductor device, the total thickness of the partial isolation insulating film PT1 is not reduced according to the scale ratio, but can be maintained at substantially the same thickness.

The total thickness of the partial isolation insulating film PT1, which is greater the better from the viewpoint of suppressing the parasitic capacitance, is practically set to twice to six times that of the isolation portion. The thickness of the isolation portion is set to less than half (more preferably, to one-third to one-quarter) of that of the SOI layer 3.

Since the hybrid isolation insulating film HT1 provided between the NMOS regions NR and the PMOS region PR achieves complete electrical isolation between the two regions, as shown in FIG. 4, the occurrence of latchup is prevented.

In addition, the manufacture is carried out effectively by forming the partial isolation insulating film PT1 during the steps of forming the hybrid isolation insulating film HT1.

Since the source/drain layers 15 and 25 which are high concentration impurity regions are formed in contact with the buried oxide film 2, as shown in FIG. 4, a depletion layer comes into contact with the buried oxide film 2 at the time of transistor operation. Accordingly, the parasitic capacitance of the source/drain is smaller than that of a device formed on a bulk silicon substrate (bulk device), ensuring superiority of SOI device over bulk device.

Since the trench depth (the thickness of the isolation portion) is less than half of that of the SOI layer 3, less stress is applied to the SOI substrate in providing the isolation structure, which suppresses an abnormal junction leak current of the source/drain resulting from the stress.

The body fixing region which is a high concentration impurity region and the body region of the transistor are electrically connected to each other through the under-isolation SOI layer, as shown FIG. 5. It is therefore desirable that the thickness of the under-isolation SOI layer be increased to the greatest extent practicable in each of the NMOS region NR and the PMOS region PR in order to reduce the resistance value. In this respect, the structure according to this invention has the advantage of increasing the thickness of the under-isolation SOI layer by reducing the thickness of the isolation portion.

In forming the source/drain layer, there is a possibility that part of the source/drain impurities is implanted (source/drain implantation) in the under-isolation SOI layer through the isolation insulating film, causing a reduction of the effective concentration of impurity (of conductivity type opposite to that of the source/drain impurities) included in the SOI layer and an increase of the resistance value of the under-isolation SOI layer. In this respect, the structure according to this invention again has the advantage of increasing the thickness of the under-isolation SOI layer thus canceling a possible increase to a certain degree of the resistance value of the under-isolation SOI layer resulting from the source/drain implantation.

A-4. Modification

The above description refers to a structure in which the under-isolation SOI layer is of greater thickness than the isolation portion of the isolation insulating film. Alternatively, if the resistance value of the under-isolation SOI layer does not need to be considered, such structure is not necessarily required as long as the protruding portion of the isolation insulating film is of greater thickness than the isolation portion.

B. Second Preferred Embodiment

B-1. Device Structure

In the first preferred embodiment described above, the isolation insulating films such as the partial isolation insulating films PT1 and the hybrid isolation insulating film HTI have the same thickness between the NMOS region NR and the PMOS region PR. Alternatively, the isolation insulating films may have different thicknesses between the NMOS region NR and the PMOS region PR.

That is, when the gate electrodes are formed by providing a polysilicon layer which is a gate electrode material on the overall surface of the substrate, and then performing selective etching at the same time in the NMOS region NR and the PMOS region PR, the doses of impurities to be implanted in the gate electrodes (gate implantation) are different between N-channel type and P-channel type, so the etching rates in molding are different as well, resulting in gate electrode lengths of different finished dimensions.

More specifically, with the same gate width and the same thickness of the protruding portion of the isolation insulating film, the P-channel type MOS transistor having a smaller gate etching rate than the N-channel type MOS transistor will have a wider gate electrode length by approximately 10 to 20 nm.

However, the gate electrode length of the P-channel type MOS transistor can be rendered substantially the same as that of the N-channel type MOS transistor by reducing the thickness of the protruding portion of the isolation insulating film in the PMOS region PR.

The reasons for this will be described with reference to FIGS. 13 to 17.

Figure 13:
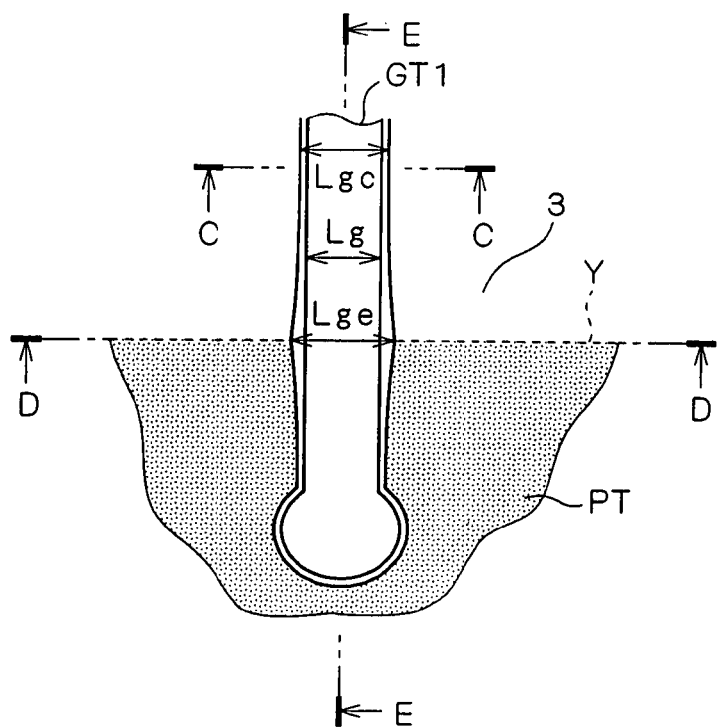
FIG. 13 illustrates a plan view for explaining a gate length variation of a gate electrode.

FIG. 13 illustrates a plan view of a gate electrode GT1 extending from over the SOI layer 3 to over an isolation insulating film PT. The boundary of the SOI layer 3 and the isolation insulating film PT is indicated by a broken line Y, and an isolation region is hatched.

As shown in FIG. 13, the gate electrode GT1 is formed to have inclined side surfaces with the spreading bottom. A gate length in a bottom surface portion of the gate electrode GT1, namely, in a portion in contact with the SOI layer 3 or the isolation insulating film PT, is wider than a gate length Lg in an upper surface portion of the gate electrode GT1.

Assume that a gate length in a bottom surface portion of the gate electrode GT1 on the boundary part of the SOI layer 3 and the isolation insulating film PT is Lge, and a gate length in a bottom surface portion of the gate electrode GT1 at the central part thereof in the gate width direction is Lgc.

Such shape is a general phenomenon. It is desirable that the inclination angle be close to vertical from the viewpoint of controlling the gate dimensions.

However, the reality is that the inclination is more noticeable on the boundary of the SOI layer 3 and the isolation insulating film PT. The reason for this is believed to be that, when forming the polysilicon layer which is a gate electrode material, the thickness of the gate electrode material on the boundary part between the isolation insulating film PT and the SOI layer 3 is increased due to step height between them, which hinders uniform etching progress in the whole region.

Figure 14:
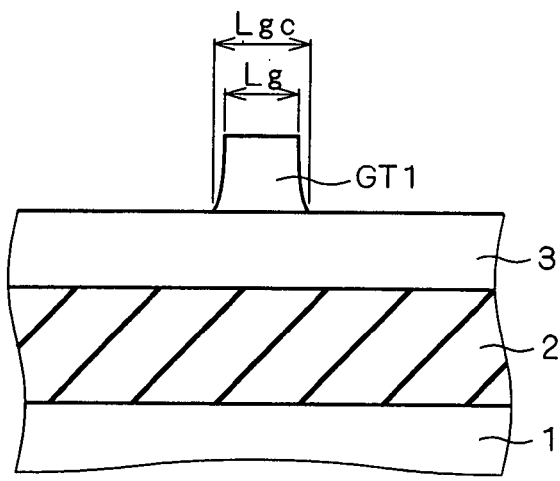
FIGS. 14 to 16 illustrate cross-sectional views for explaining the gate length variation of the gate electrode.
Figure 15:
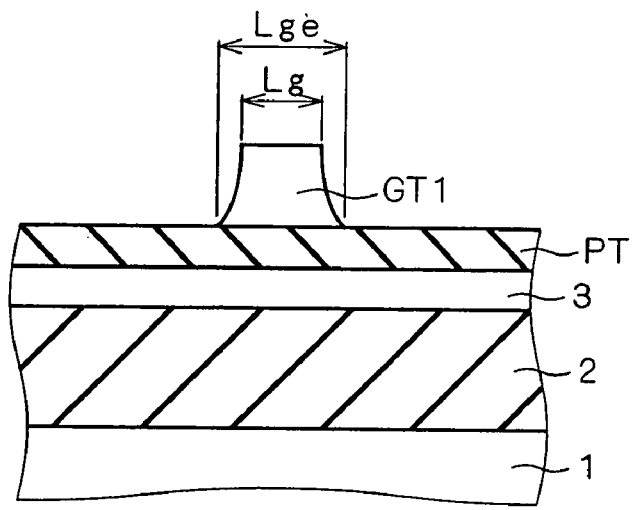
Figure 16:
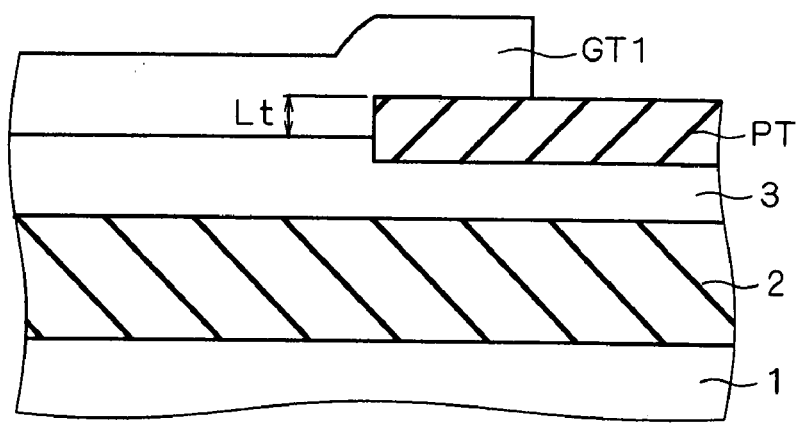

FIGS. 14 to 16 illustrate cross-sectional views of the configuration of the gate electrode GT1, taken along the lines C-C, D-D, and E-E in FIG. 13, respectively.

The variations in length of the gate electrode GT1 depending on the location thereof, as shown in FIGS. 14 and 15, may affect the operating characteristics of the MOS transistor.

Assuming that a difference between the lengths Lge and Lgc (Lge−Lgc) is ΔLg (range of gate length variation), it can be said that the smaller ΔLg becomes, the more uniform the gate length becomes across the gate electrode thus achieving more favorable operating characteristics of the MOS transistor.

ΔLg has a tendency to increase as the thickness of the protruding portion of the isolation insulating film increases.

Figure 17:
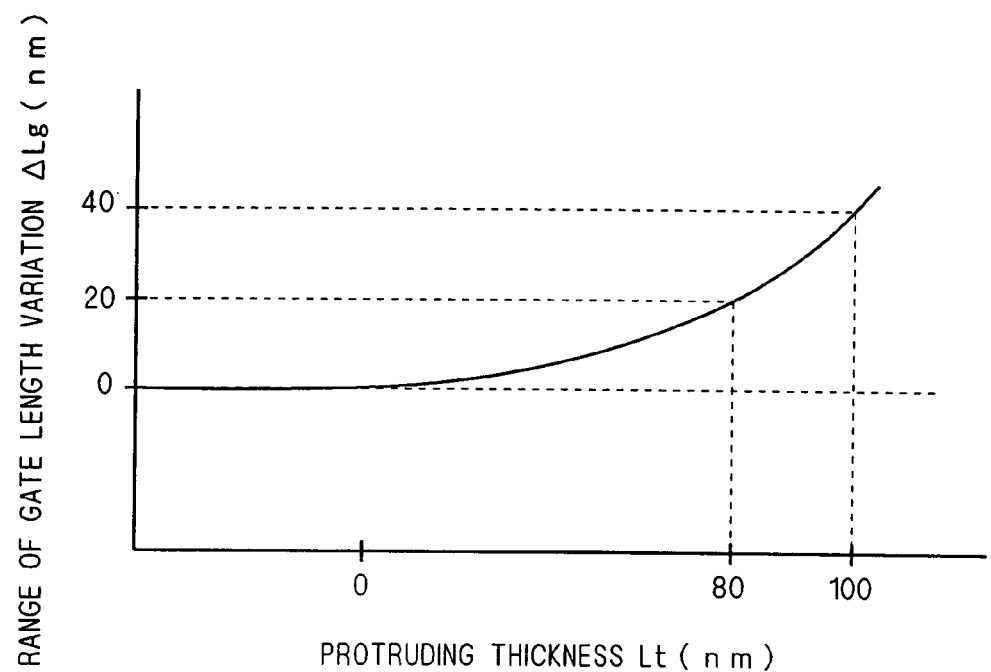
FIG. 17 shows the relationship between a range of gate length variation and a thickness of a protruding portion of an isolation insulating film.

FIG. 17 shows the relationship between the range of gate length variation ΔLg and a thickness (protruding thickness) Lt (FIG. 16) of the protruding portion of the isolation insulating film.

As shown in FIG. 17, ΔLg is 40 nm when the protruding thickness Lt is 100 nm, and is 20 nm when the protruding thickness Lt is 80 nm.

As such, the range of gate length variation can be reduced by reducing the thickness of the protruding portion of the isolation insulating film. This in turn prevents the widening of gate electrode length.

Utilizing this phenomenon, the gate electrode lengths of different finished dimensions resulting from the different gate etching rates can be resolved.

That is, as has been described, with the same gate width and the same thickness of the protruding portion of the isolation insulating film, the P-channel type MOS transistor will have a wider gate electrode length by approximately 10 to 20 nm than the N-channel type MOS transistor. However, by reducing the protruding thickness of the isolation insulating film in the PMOS region PR by approximately 10 to 20 nm than that in the NMOS region NR, ΔLg is reduced by 10 to 20 nm, as shown in FIG. 17, thus resolving the widening of gate electrode length. As a result, the gate electrode length of the P-channel type MOS transistor can be rendered substantially the same as that of the N-channel type MOS transistor.

Figure 18:
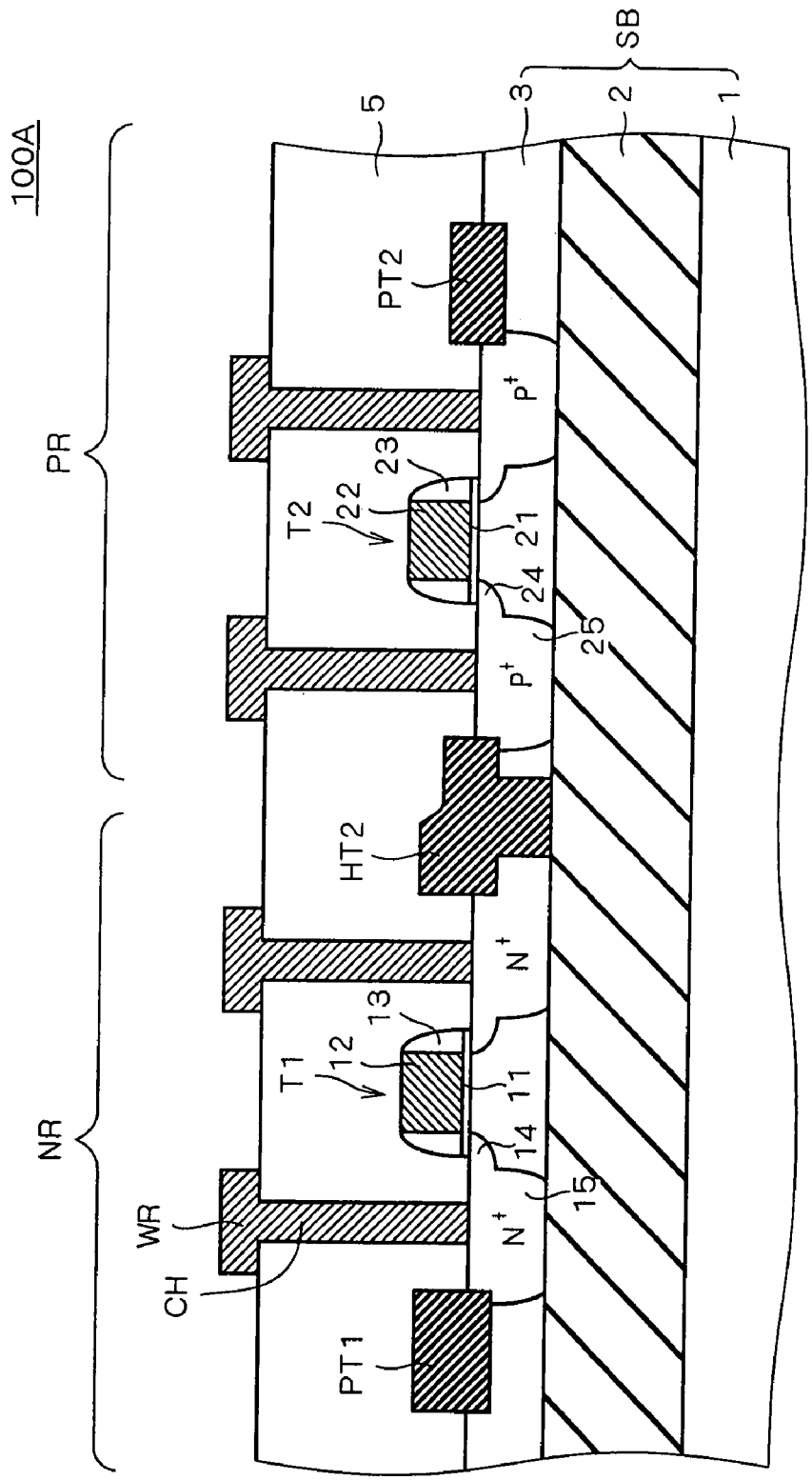
FIG. 18 shows a cross-sectional configuration of an SOI device according to a second preferred embodiment of this invention.

FIG. 18 shows an SOI device 100A as an exemplary structure in which isolation insulating films have different thicknesses between the NMOS region NR and the PMOS region PR. In FIG. 18, corresponding parts to those of the SOI device 100 in FIG. 4 are referred to by the same reference numerals, to omit redundant description.

As shown in FIG. 18, a hybrid isolation insulating film HT2 that electrically isolates the NMOS region NR and the PMOS region PR is formed such that the protruding portion on the PMOS region PR side is of smaller thickness than that on the NMOS region NR side.

Accordingly, when the gate electrode 22 of the MOS transistor T2 extends over the hybrid isolation insulating film HT2, the widening of length of the gate electrode 22 is prevented.

Further, the protruding portion of a partial isolation insulating film PT2 provided between the MOS transistors in the PMOS region PR is of smaller thickness than that of the partial isolation insulating film PT1 in the NMOS region NR.

By adopting such structure, the length of the gate electrode 22 of the P-channel type MOS transistor T2 having a smaller gate etching rate can be rendered substantially the same as that of the N-channel type MOS transistor T1.

B-2. Manufacturing Method

A method of manufacturing the SOI device 100A will be described with reference to FIGS. 19 and 20.

First, the manufacturing steps of the SOI device 100 which were explained with reference to FIGS. 6 to 11 are performed by filling the trenches TR1, TR11 and TR2 completely with the silicon oxide film OX2, and then polishing and planarizing the silicon oxide film OX2 by the CMP process to the point where at least the surface of the silicon nitride film SN is exposed.

Figure 19:
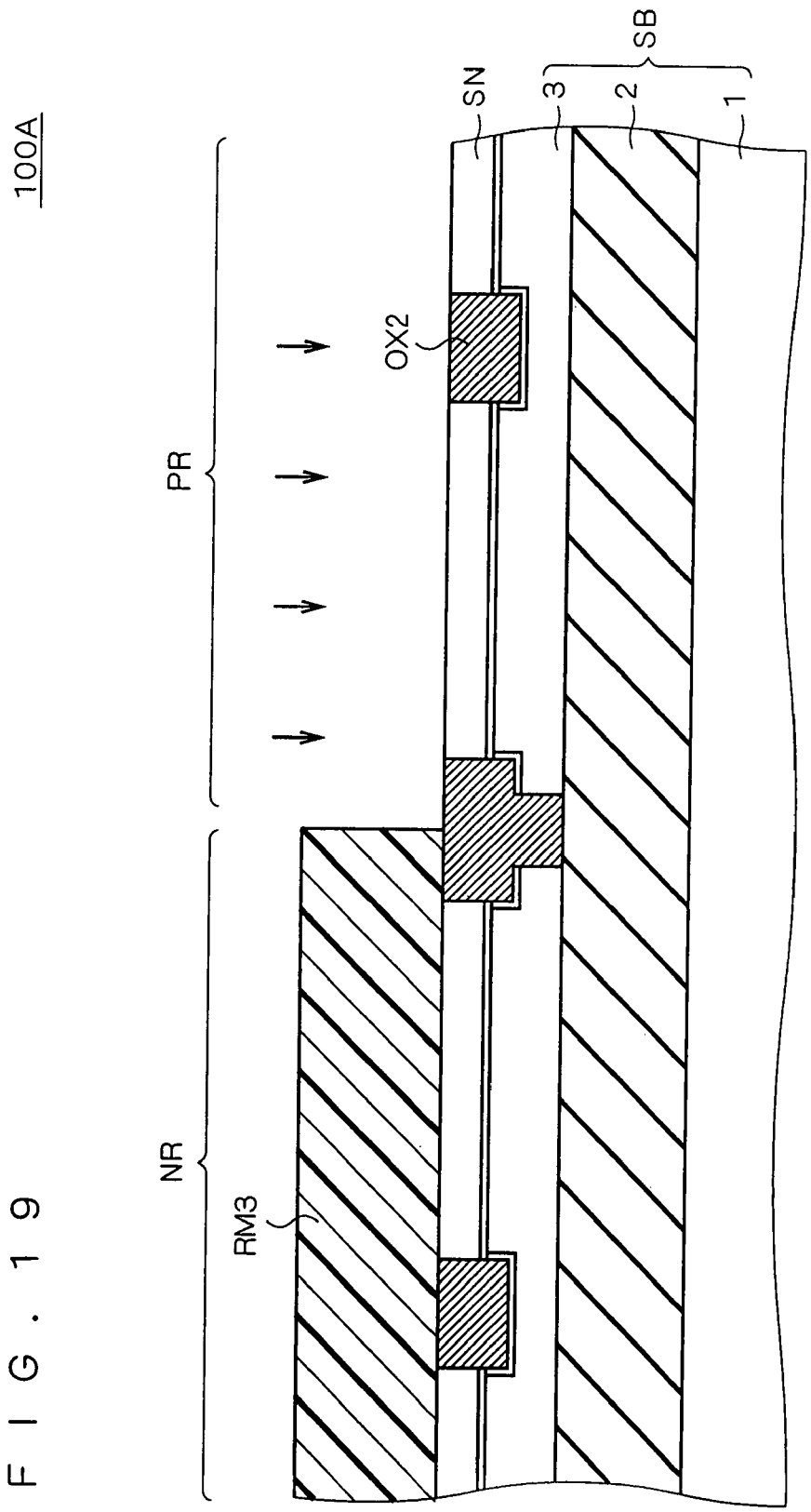
FIGS. 19 to 20 illustrate cross-sectional views for explaining a method of manufacturing the SOI device according to the second preferred embodiment.

Next, in a FIG. 19 step, the surface of the NMOS region NR is covered with a resist mask RM3, and ion implantation is performed in the whole PMOS region PR. This ion implantation should be such that boron (B), phosphorous (P), or arsenic (As) ions are implanted in a dose of $1 \times 10^{12}$/ cm$^2$ or above. The implantation energy is set to 30 KeV or below when using As, and to 10 KeV or below when using B or P, so that implantation damage is caused in the vicinity of the surface of the silicon oxide film OX2.

The resist mask RM3, is removed afterward, and a hydrofluoric (HF) acid process is then performed. The silicon oxide film OX2 in the PMOS region PR with the implantation damage, which has a higher etching rate to hydrofluoric acid than the silicon oxide film OX2 in the NMOS region NR, is etched at a higher speed to have the protruding portion of smaller thickness than that on the NMOS region NR side. Then, the silicon nitride film SN and the pad oxide film PDX are removed by wet etching or dry etching.

Figure 20:
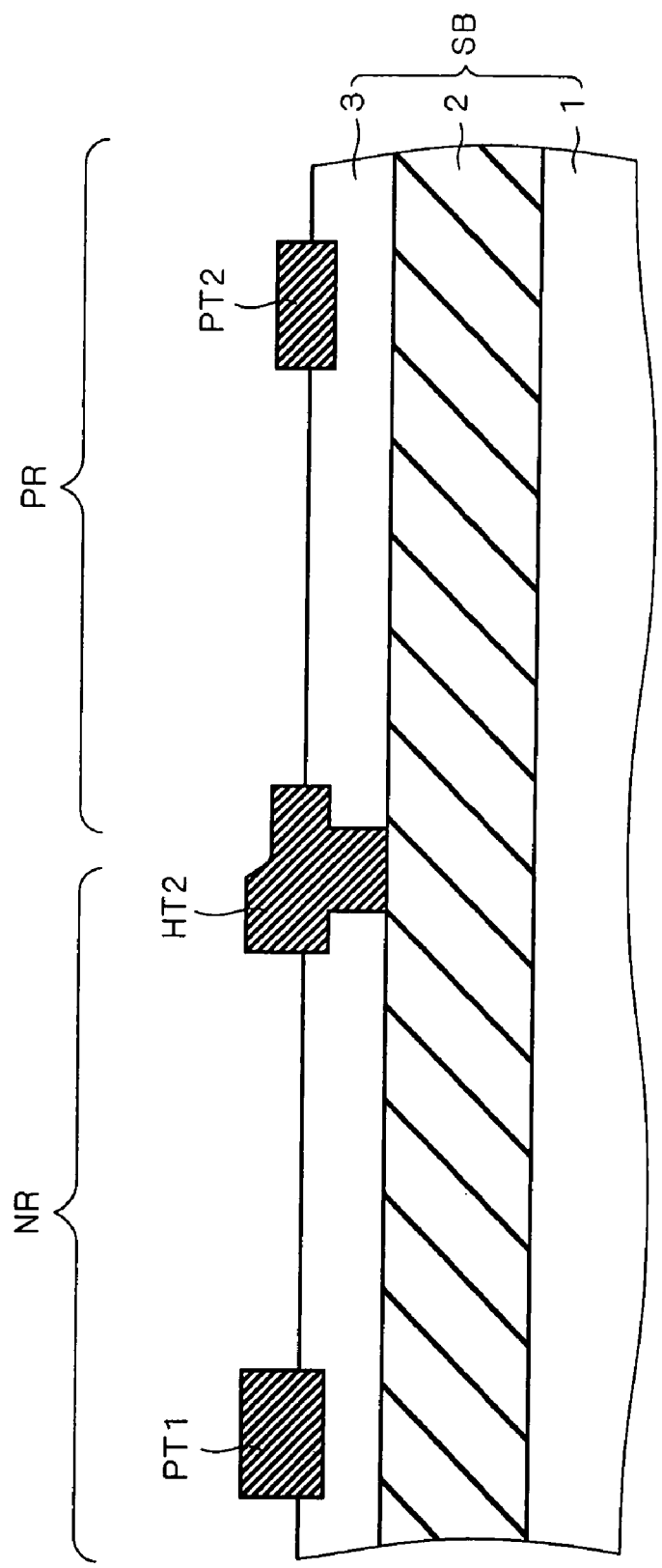

Thus obtained are the hybrid isolation insulating film HT2 having the protruding portion on the PMOS region PR side of smaller thickness than that on the NMOS region NR side, and the partial isolation insulating film PT2 of smaller thickness than the partial isolation insulating film PT1, as shown in FIG. 20.

B-3. Effect

As described above, with the isolation insulating films of different thicknesses between the NMOS region and the PMOS region, the gate electrode lengths of different finished dimensions resulting from the different gate etching rates can be resolved.

B-4. First Modification

The above description refers to a structure in which the isolation insulating films have different thicknesses between the NMOS region and the PMOS region. Alternatively, the isolation insulating films may have different thicknesses between regions having different operating voltages.

Take a semiconductor device including an input/output circuit (I/O) part and a core circuit part, the I/O part having an operating voltage of 3.3 V and the core circuit part having an operating voltage of 1.2 V, for example.

In such semiconductor device, the gate electrode length of a MOS transistor is set thicker and less restricted in terms of dimensional control in the I/O part than in the core circuit part.

Thus, the protruding thickness of an isolation insulating film can be set greater and the parasitic capacitance of the gate electrode can be reduced further in the I/O part than in the core circuit part.

When the gate length in the core circuit part is set to 100 nm and the gate length in the I/O part is set to 400 nm, for example, with the above-described range of gate length variation ΔLg being 20 nm, a ratio of dimensional variations of the core circuit part is 20/100, i.e. 20%, and a ratio of dimensional variations of the I/O part is 20/400, i.e. 5%.

Therefore, if the ratio of dimensional variations up to 20% is within tolerance, the range of gate length variation ΔLg is 80 nm and its corresponding protruding thickness of the isolation insulating film reaches a value exceeding 100 nm in the core circuit part (FIG. 17). The protruding thickness in the core circuit part is 80 nm from FIG. 17.

Figure 21:
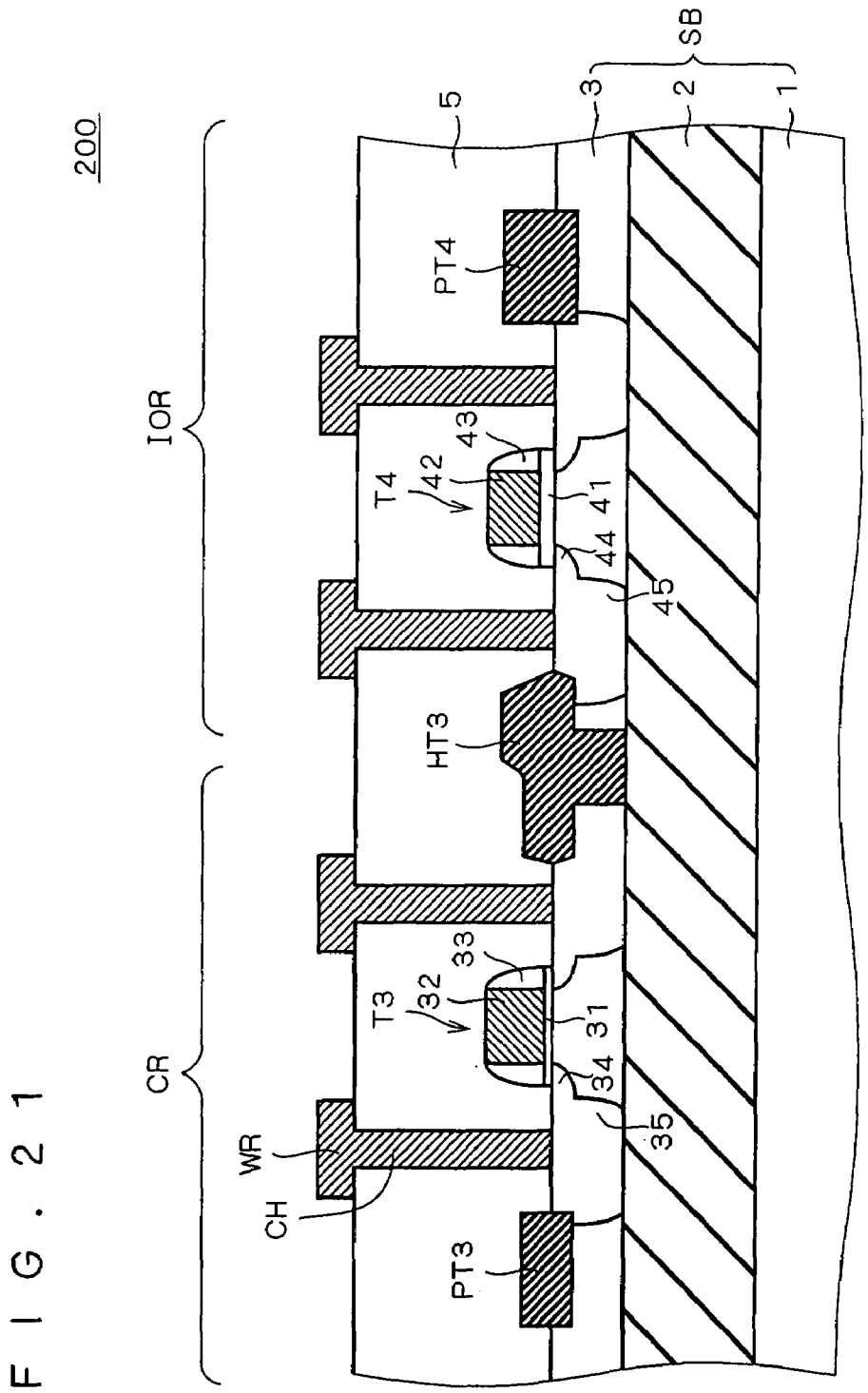
FIG. 21 shows a cross-sectional configuration of a modification of the SOI device according to the second preferred embodiment.

FIG. 21 shows an SOI device 200 as an exemplary structure in which isolation insulating films have different thicknesses between the core circuit part and the I/O part.

As shown in FIG. 21, the SOI device 200 is provided on an SOI substrate SB consisting of a silicon substrate 1, a buried oxide film 2 provided on the silicon substrate 1, and an SOI layer 3 provided on the buried oxide film 2.

The surface of the SOI substrate SB is divided into a core circuit region CR (second region) and an input/output circuit region IOR (first region). The two regions are electrically isolated from each other by a hybrid isolation insulating film HT3.

The hybrid isolation insulating film HT3 has a substantially T-shaped cross-sectional shape that includes the FTI structure reaching the buried oxide film 2 through the SOI layer 3 at its center, and the PTI structure having the SOI layer 3 provided thereunder at its both ends.

In the core circuit region CR and the input/output circuit region IOR, partial isolation insulating films PT3 and PT4 are provided between MOS transistors, respectively.

A MOS transistor T3 forming the core circuit region CR includes a gate insulating film 31 provided selectively on the SOI layer 3, a gate electrode 32 provided on the gate insulating film 31, and a sidewall insulating film 33 provided to cover the side surfaces of the gate electrode 32.

A source/drain layer 35 is provided in the surface of the SOI layer 3 outside the sidewall insulating film 33 of the MOS transistor T3, and an extension layer 34 is provided at a shallower position than the source/drain layer 35.

A MOS transistor T4 forming the input/output circuit region IOR includes a gate insulating film 41 provided selectively on the SOI layer 3, a gate electrode 42 provided on the gate insulating film 41, and a sidewall insulating film 43 provided to cover the side surfaces of the gate electrode 42. The gate insulating film 41 of the MOS transistor T4 is of greater thickness than the gate insulating film 43 of the MOS transistor T3.

A source/drain layer 45 is provided in the surface of the SOI layer 3 outside the sidewall insulating film 43 of the MOS transistor T4, and an extension layer 44 is provided at a shallower position than the source/drain layer 45.

As shown in FIG. 21, the hybrid isolation insulating film HT3 that electrically isolates the core circuit region CR and the input/output circuit region IOR is formed such that the protruding portion on the input/output circuit region IOR side is of greater thickness than that on the core circuit region CR side.

Further, the protruding portion of the partial isolation insulating film PT4 provided between the MOS transistors in the input/output circuit region IOR is of greater thickness than that of the partial isolation insulating film PT3 in the core circuit region CR.

Such structure allows a further reduction in parasitic capacitance of the gate electrode in the input/output circuit region IOR.

B-5. Second Modification

B-5-1. First Application Example to Memory Cell Part

Memory devices such as SRAMs (Static Random Access Memory) have a memory cell part and an operation part performing a logic operation process. In the memory cell part where dimensional control of a gate electrode is of importance, it is desirable that the protruding portion of an isolation insulating film is of smaller thickness than those in other circuit regions including the operation part.

That is, in the memory cell part, a gate electrode is usually set to have a width close to the processing limit for a higher degree of integration. Meanwhile, in other circuit regions including the operation part, a gate electrode is set to have a wider width than that in the memory cell part.

Since the narrower the gate electrode width, the wider (thicker) the gate electrode length on condition of the same thickness of the protruding portions of isolation insulating films, it is desirable that the protruding portion of an isolation insulating film in the memory cell portion have a smaller thickness by 10 to 20 nm than those in the other regions.

Such structure allows easy dimensional control of the gate electrode in the memory cell part.

Further, the adoption of FTI structure for all isolation insulating films in the memory cell part is effective at reducing the parasitic capacitance. By doing so, the thicknesses of the protruding portions of the isolation insulating films can be reduced, which reduces the range of gate length variation and allows easy dimensional control of the gates.

When the FTI structure is adopted for all the isolation insulating films in the memory cell part, the substrate floating effect may exert its influence on MOS transistors. Such influence is reduced effectively by using P-channel type MOS transistors to form the memory cell part.

This is because a P-channel type MOS transistor, which has lower mobility of carriers, smaller current, and smaller accumulation of excess carriers in a body region than an N-channel MOS transistor, is less affected by the substrate floating effect.

In the operation part and peripheral circuits such as a decoder arranged on the periphery of the memory cell part, the substrate floating effect may be suppressed by using isolation insulating films having the PTI structure and HTI structure, like the SOI device 100 which was described with reference to FIG. 4.

B-5-2. Second Application Example to Memory Cell Part

When it is not possible to form the memory cell part by using transistors all of which are P-channel type, like when a CMOS (Complementary MOS) inverter is included, for example, it is effective to adopt the FTI structure for all the isolation insulating films in the PMOS region PR in which the P-channel type MOS transistors are provided. An example of such structure will be described with reference to FIGS. 22 and 23.

FIG. 22 illustrates a plan view of a region including the CMOS inverter in the memory cell. This region is divided into the PMOS region PR and the NMOS region NR.

As shown in FIG. 22, a plurality of active regions AR are provided in parallel, and gate electrodes GT10 and GT20 are provided across the plurality of active regions AR. Both of the gate electrodes GT10 and GT20 are provided across the active regions AR in the PMOS region PR as well as the active regions AR in the NMOS region NR, to form a common gate electrode of P-channel type and N-channel type MOS transistors that form the CMOS inverter.

Figure 23:
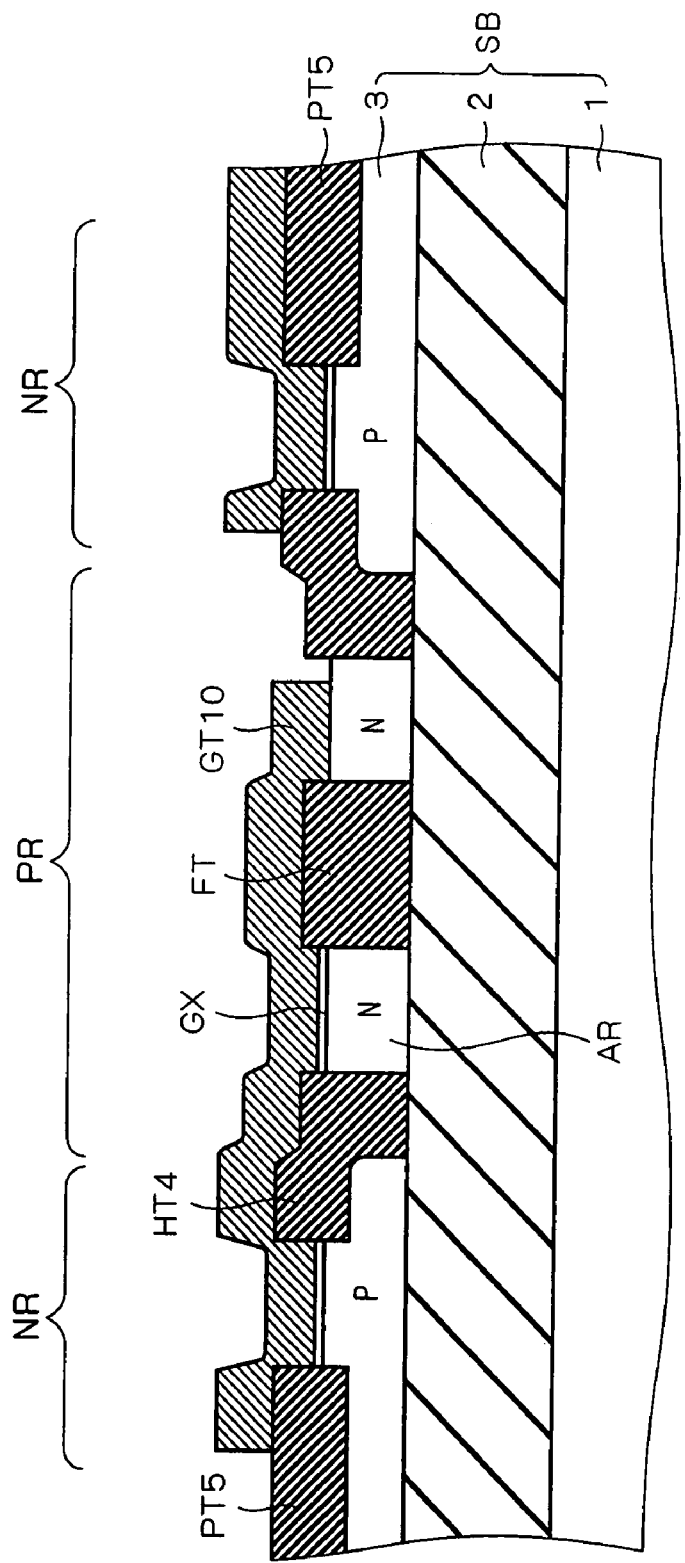
FIG. 23 shows a cross-sectional configuration of the modification of the SOI device according to the second preferred embodiment.

FIG. 23 illustrates a cross-sectional view of a configuration taken along the line G-G in FIG. 22.

As shown in FIG. 23, the surface of the SOI substrate SB is divided into the PMOS region PR and NMOS region NR which are electrically isolated from each other by a hybrid isolation insulating film HT4. A full isolation insulating film FT is provided between MOS transistors in the PMOS region PR, while a partial isolation insulating film PT5 is provided between MOS transistors in the NMOS region NR. The gate electrode GT10 is provided across the plurality of active regions AR with a gate insulating film GX interposed therebetween.

The hybrid isolation insulating film HT4 has the FTI structure reaching the buried oxide film 2 through the SOI layer 3 on the PMOS region PR side, and the PTI structure having the SOI layer 3 provided thereunder on the NMOS region NR side.

Further, the protruding portions of the full isolation insulating film FT and the hybrid isolation insulating film HT4 in the PMOS region PR are of smaller thicknesses than those in the NMOS region NR.

By reducing the thicknesses of the protruding portions in the FTI structures in this manner, the range of gate length variation is reduced, which allows easy dimensional control of the gates.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a SOI substrate including a substrate part serving as a base, a buried oxide film provided on said substrate part, and an SOI layer provided on said buried oxide film;
   first and second element isolation insulating films provided in first and second regions on said SOI layer, respectively; and
   a third element isolation insulating film provided between said first and second regions, wherein
   said first and second element isolation insulating films have a partial trench isolation structure having said SOI layer provided thereunder,
   said third element isolation insulating film at least partly includes a full trench isolation structure reaching said buried oxide film through said SOI layer, and
   said first and second element isolation insulating films have a structure in which a thickness of a protruding portion protruding upward from a main surface of said SOI layer is greater than a thickness of an isolation portion extending below said main surface of said SOI layer
   wherein
   said first and second element isolation insulating films are formed so that a thickness of an under-isolation SOI layer under said isolation portion is greater than a thickness of said isolation portion.

2. The semiconductor device according to claim 1, wherein
   said third element isolation insulating film has a hybrid trench isolation structure including said full trench isolation structure and said partial trench isolation structure, said partial trench isolation structure being formed so that a thickness of said protruding portion is greater than a thickness of said isolation portion extending below said main surface of said SOI layer, and a thickness of said under-isolation SOI layer is greater than a thickness of said isolation portion.

* * * * *